(12) United States Patent
Liu et al.

(10) Patent No.: US 8,149,024 B2
(45) Date of Patent: Apr. 3, 2012

(54) DUAL FUNCTION VOLTAGE AND CURRENT MODE DIFFERENTIAL DRIVER

(75) Inventors: Xin Liu, El Dorado Hills, CA (US);
Arvind Bomdica, Fremont, CA (US);
Yikai Liang, Fremont, CA (US);
Ming-Ju Edward Lee, San Jose, CA (US); Rohit Rathi, San Diego, CA (US);
Jinyung Namkoong, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 12/633,174

(22) Filed: Dec. 8, 2009

(65) Prior Publication Data

US 2011/0133788 A1    Jun. 9, 2011

(51) Int. Cl.
*H03K 3/00* (2006.01)
(52) U.S. Cl. .......................... 327/108; 327/109
(58) Field of Classification Search .................. 327/108, 327/109
See application file for complete search history.

(56) References Cited

U.S. PATENT DOCUMENTS

| | | | |
|---|---|---|---|
| 6,005,414 A * | 12/1999 | Reay | |
| 6,437,599 B1 * | 8/2002 | Groen | |
| 6,531,896 B1 * | 3/2003 | Song | 326/86 |
| 6,665,347 B2 * | 12/2003 | van Bavel et al. | |
| 6,686,772 B2 | 2/2004 | Li et al. | |
| 6,700,403 B1 * | 3/2004 | Dillon | |
| 6,812,733 B1 * | 11/2004 | Plasterer et al. | |
| 7,109,743 B2 * | 9/2006 | Shumarayev et al. | 326/26 |
| 7,145,359 B2 * | 12/2006 | Hein et al. | |
| 7,307,446 B1 * | 12/2007 | Shumarayev et al. | 326/26 |
| 7,483,688 B2 * | 1/2009 | Huang et al. | |
| 7,501,851 B2 * | 3/2009 | Venditti et al. | 326/30 |
| 7,643,563 B2 * | 1/2010 | Huang et al. | |
| 7,817,727 B2 * | 10/2010 | Kumar et al. | |
| 2004/0070451 A1 * | 4/2004 | Pihlstrom et al. | |
| 2005/0032501 A1 * | 2/2005 | Huang et al. | |
| 2008/0034378 A1 * | 2/2008 | Kumar et al. | |
| 2008/0048728 A1 * | 2/2008 | Hong et al. | |

* cited by examiner

*Primary Examiner* — Ryan Jager
(74) *Attorney, Agent, or Firm* — Volpe and Koenig, P.C.

(57) ABSTRACT

A dual function differential driver includes a voltage mode differential driver portion and a current mode differential driver portion. Control circuitry is connected to the voltage mode differential driver portion and the current mode differential driver portion. The control circuitry switches the dual function differential driver between operation as a voltage mode differential driver and operation as a current mode differential driver.

9 Claims, 3 Drawing Sheets

DUAL FUNCTION VOLTAGE AND CURRENT MODE DIFFERENTIAL DRIVER

FIELD OF INVENTION

This application is related to the differential drivers.

BACKGROUND

Differential drivers are employed for a variety of functions, such as to provide parallel data to serial data conversion. For example, they may be used to convert a parallel 10-bit digital data signal to a serial 1-bit digital data signal. Also, differential drivers may be employed to convert 1-bit serial digital data signal, (e.g., a rail-to-rail digital signal swinging from 0 V to VDD), to a pair of differential analog signals that meet an electrical specification of a transmitter for a relevant signaling standard.

High speed input/output (I/O) interfaces such as serial-ATA (SATA) require a transmitter to meet different rise and fall (rise/fall) time specifications depending on the generation specification they are operating under. The generation one (Gen1) SATA specification requires a 1.5 Gb/s data rate, while the generation two (Gen2) specification requires a 3 Gb/s data rate, and generation three (Gen3) specification requires a 6 Gb/s data rate. At the same time, the transmitter should also meet a maximum of 20 ps differential skew specifications. The transmitter output signal incurs a larger loss on the transmitting channel at the Gen3 data rate than at the Gen1 data rate due to the limited bandwidth of the channel. To compensate for this channel loss, the transmitter has to output a larger amplitude signal at the Gen3 data rate than at Gen1 data rate.

The rise/fall time specification of SATA Gen3 is from 33 ps to 68 ps, Gen2 is from 67 ps to 136 ps, and Gen1 is from 100 ps to 273 ps. At the Gen3 data rate, the transmitter power consumption may be of concern, particularly when multiple lanes of transmitters are running at a high speed at the same time. Therefore, a differential driver that is effective for transmission at one rate may not be as effective at other rates. The two differential drivers that are commonly used are voltage-mode differential drivers and current-mode differential drivers.

A voltage-mode differential driver may be utilized when running at high speeds, such as the SATA Gen3 data rate, because it consumes lower power than a current-mode differential driver. However, when the same voltage-mode differential driver runs at a relatively low speed, such as the SATA Gen1 data rate, which is four times slower than the Gen3 data rate, the drive strength of the voltage-mode driver has to be weakened by many times to slow down the output signals in order to meet the slower rise/fall time requirement of the Gen1 specification.

To weaken the drive strength, the majority of the transistors in a voltage-mode differential driver have to be turned off. The situation then occurs that a small number of turned-on transistors have to drive a large number of turned-off transistors whose parasitic capacitance is not only very large, but also varies a lot across process, voltage, and temperature (PVT) corners. Therefore, the output rise/fall time of the weakened voltage-mode driver may incur a large variation across PVT corners, which may in turn cause a large mismatch between the rise time and fall time, ultimately causing a large differential skew between the two differential output signals. The transmitter may then not be able to simultaneously meet the rise/fall time and differential skew requirements at the low speed.

A current-mode differential driver, on the other hand, may be utilized to handle the rise/fall time variation and differential skew issues at the low speed, because its rise/fall time is determined by a resistive-capacitance (RC) time constant and therefore has less variation across PVT corners than a voltage-mode differential driver. However, the current-mode driver consumes much more power than a voltage-mode driver when running at high speeds such as the SATA Gen3 data rate. In multiple lane applications, the total power consumption becomes so large that the number of lanes that simultaneously run at the Gen3 data rate may have to be limited.

Therefore, it is challenging to both save power at high speed data rates and also meet different rise/fall times and strict differential skew requirements at low speeds. In Gigabit high speed circuit design, the less the loading, the faster the circuit can run and the less power the circuit consumes. Therefore, a circuit that occupies a smaller area may operate faster and consume less power when running at a specific speed.

Accordingly, it would be beneficial to provide a differential driver that is capable of effectively operating at both a low speed data rate, such as a Gen1 data rate, when required, while also being capable of operating at a higher speed data rate, such as a Gen2 or Gen3 data rate when required.

SUMMARY

A dual function voltage and current mode differential driver is disclosed. The dual function voltage and current mode differential driver includes a voltage mode differential driver portion and a current mode differential driver portion. Control circuitry is connected to the voltage mode differential driver portion and the current mode differential driver portion. The control circuitry switches the dual function differential driver between operation as a voltage mode differential driver and operation as a current mode differential driver.

DETAILED DESCRIPTION OF THE EMBODIMENTS

In order to achieve effective operation at both low data rates and high data rates, a dual function voltage and current mode differential driver may be utilized.

Figure 1:
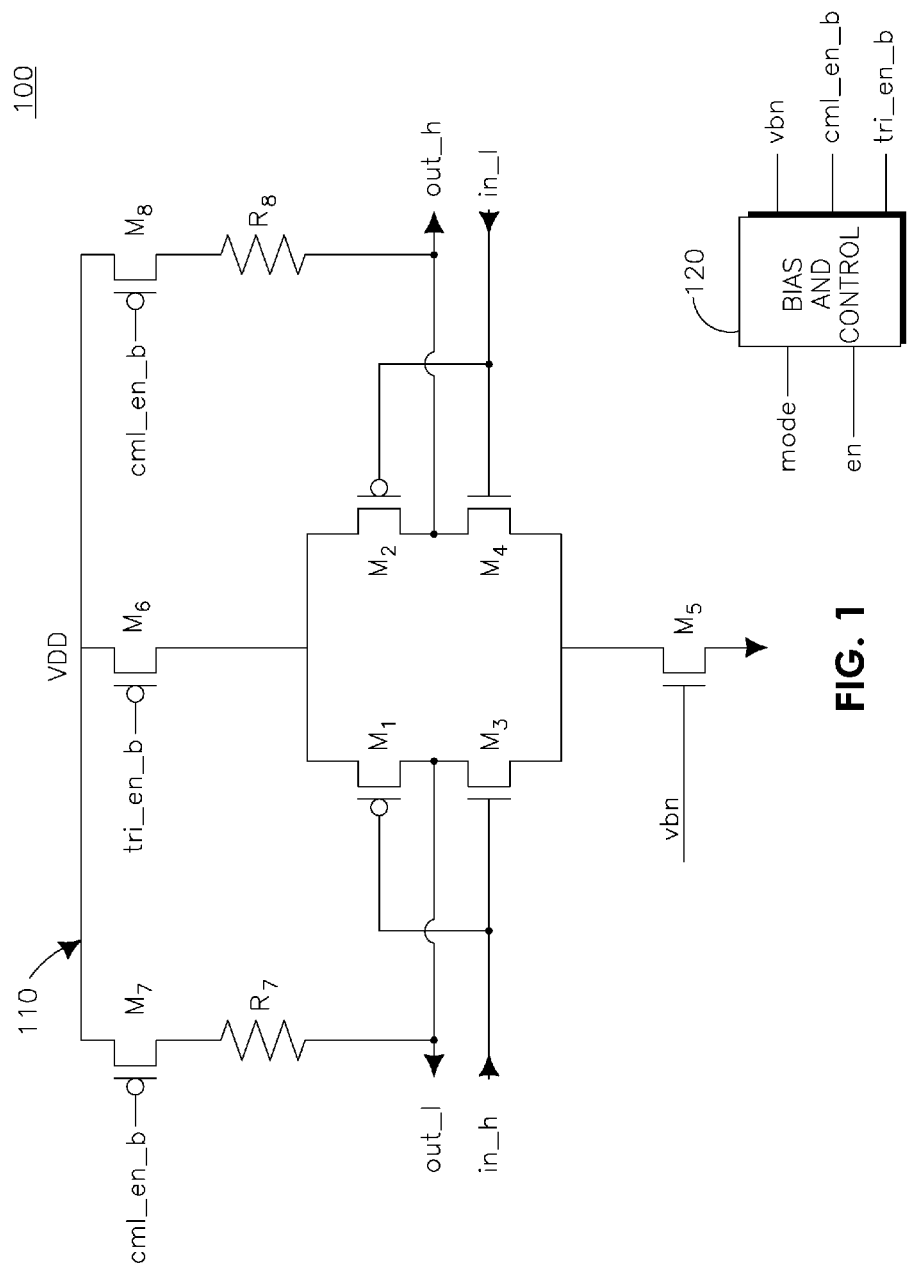
FIG. 1 is an example dual function voltage and current mode differential driver.

FIG. 1 is an example dual function voltage and current mode differential driver 100. The dual function voltage and current mode driver 100 includes a driver portion 110 and bias and control circuitry 120. The driver portion 110 includes a plurality of transistors, designated $M_1$, $M_2$, $M_3$, $M_4$, $M_5$, $M_6$, $M_7$, and $M_8$, and resistors $R_7$ and $R_8$. In this example, transistors $M_1$, $M_2$, $M_6$, $M_7$, and $M_8$ are P-metal oxide transistors (PMOS) transistors and transistors $M_3$, $M_4$, and $M_5$ are NMOS transistors. The bias and control circuitry 120 includes bitline outputs vbn (bias voltage/enable), cml_en_b (current mode logic enable), and tri_en_b (tri-state mode enable). The bias and control circuitry receives an input in the form of a mode and en (enable) bitline that instructs it to switch the driver portion 110 between operation as a current-mode differential driver and a voltage-mode differential driver.

In the example shown in FIG. 1, PMOS transistors $M_6$, $M_7$, and $M_8$ have their sources connected to the supply voltage (VDD). The gate of $M_6$ is connected to the tri_en_b bitline, and the gates of $M_7$ and $M_8$ are connected to the cml_en_b bitline. The sources of transistors $M_1$ and $M_2$ are connected to the drain of transistor $M_6$. The sources of transistors $M_3$ and $M_4$ are connected to the drain of transistor $M_5$. The gates of transistors $M_1$ and $M_3$ are connected to a high input line (in_h) and the gates of transistors $M_2$ and $M_4$ are connected to a low input line (in_l). The drains of transistors $M_1$ and $M_3$ are connected to a low output line (out_l) and the drains of transistors $M_2$ and $M_4$ are connected to a high output line (out_h). The gate of transistor $M_5$ is connected to vbn and the source is connected to ground. In the voltage-mode differential driver configuration, transistor $M_5$ turns on as a switch, while in the current-mode configuration, transistor $M_5$ supplies tail current to the source coupled current-mode driver. Resistor $R_7$ is connected on one side to the drain of $M_7$ and to out_l on the other side. Resistor $R_8$ is connected to the drain of $M_8$ on one side and to out_h on the other side.

The input lines in_l and in_h are high-speed differential input signals, where the voltage changes from zero volts (0 V) to VDD. The output lines out_h and out_l are high-speed differential output signals. As shown in the example of FIG. 1, the voltage-mode differential driver includes transistors $M_1$, $M_2$, $M_3$, $M_4$, $M_5$, and $M_6$. The current-mode differential driver includes transistors $M_3$, $M_4$, $M_5$, $M_7$, and Mg and resistors $R_7$ and $R_8$. The bias and control circuitry 120 generates the output signals vbn, cml_en_b, and tri_en_b, based on the input signals received.

When en=VDD, the input signal mode will switch the dual function driver between operation as a current-mode differential driver and a voltage-mode differential driver. When en=0V, the en signal will override the mode signal. Accordingly, whether the input signal mode is VDD or 0V, both the bias and control circuitry 120 and the dual function driver 100 will be disabled. The outputs out_h and out_l are placed in a high-impedance state.

An example operation of the dual function voltage and current mode differential driver 100 is as follows. When the bias and control circuitry 120 receives an input indicating that the driver 100 is to operate as a voltage mode driver, the tri_en_b output is set to 0 V, while both vbn and cml_en_b are set to VDD. For example, when en=VDD and mode=VDD, the bias and control circuitry 120 outputs are tri_en_b=0V, vbn=VDD, and cml_en_b=VDD. Alternatively, when en=VDD, and mode=0V, the bias and control circuitry 120 outputs are tri_en_b=0V, vbn=VDD, and cml_en_b=VDD This sets the differential driver 100 into a voltage mode driver. Accordingly, transistors $M_5$ and $M_6$ are switched on, while $M_7$ and $M_8$ are switched off. In this configuration, when in_h is equal to VDD and in_l is equal to 0 V, out_h will be VDD and out_l will be 0 V. When in_l is equal to VDD and in_h is equal to 0 V, out_l will be VDD and out_h will be 0 V.

When the bias and control circuitry 120 receives an input signal to indicating that the driver 100 is to operate as a current mode driver, it sets vbn to the bias voltage, tri_en_b to VDD, and cml_en_b to 0 V. For example, when en=VDD, and mode=0V, the bias and control circuitry 120 outputs are tri_en_b=VDD, vbn=bias voltage, and cml_en_b=0V. Alternatively, when en=VDD and mode=VDD, the bias and control circuitry 120 outputs are tri_en_b=VDD, vbn=bias voltage, and cml_en_b=0V. This sets the differential driver 100 into a current mode driver. Accordingly, $M_5$ will switch on and provide tail current for the current mode driver, while $M_6$ will turn off. Transistors $M_7$ and Mg are switched on. If in_h is VDD and in_l is 0 V, then $M_3$ is switched on and $M_4$ is switched off. Transistor $M_1$ is also switched off. If in_l is VDD and in_h is 0 V, then $M_4$ is switched on and $M_3$ is switched off. Transistor $M_2$ is also switched off. Since in one case or the other, either $M_1$ or $M_2$ is switched off, the out_h and out_l signals will not be shorted by $M_1$ and $M_2$. The tail current of $M_5$ may be referred to as I5 and the resistors $R_7$ and $R_8$ may be collectively referred to as 'R'. Accordingly, when in_h is VDD and in_l is 0 V, then out_h is VDD and out_l is (VDD−I5*R). When in_h is 0 V and in_l is VDD, then out_h is (VDD−I5*R) and out_l is VDD.

When the input to the bias and control circuitry 120 indicates that the dual function driver is to be disabled, tri_en_b is set to VDD, cml_en_b is set to VDD, and vbn is set to 0 V. Accordingly, the outputs out_h and out_l are placed in a high-impedance state, and $M_5$, $M_6$, $M_7$, and $M_8$ are switched off. The bias and control circuitry 120 and the transistors $M_5$, $M_6$, $M_7$, and $M_8$ operate as a control circuitry to switch the driver 100 between a voltage mode differential driver and a current mode differential driver.

The example driver 100 depicted in FIG. 1 includes a single signal path from the input lines to the output lines and $M_3$, $M_4$, and $M_5$ are shared between the voltage mode and the current mode driver operation. With respect to the input signal, the high speed input signal in_h and in_l each only drive two transistors. That is, in_h drives $M_1$ and $M_3$, and in_l drives $M_2$ and $M_4$. Accordingly, the loading that in_h and in_l have in a circuit that achieves the dual function of a voltage mode and current mode driver is greatly reduced.

With respect to the output signal, the high speed output signal out_h and out_l each only see one resistor and the drain diffusion of two transistors as its loading. That is, out_h sees $R_7$ and the drains of $M_1$ and $M_3$, and out_l sees $R_8$ and the drains of $M_2$ and $M_4$. Accordingly, the loading that out_h and out_l have in such a circuit that achieves the dual functions of a current and voltage mode driver is greatly reduced.

Figure 2:
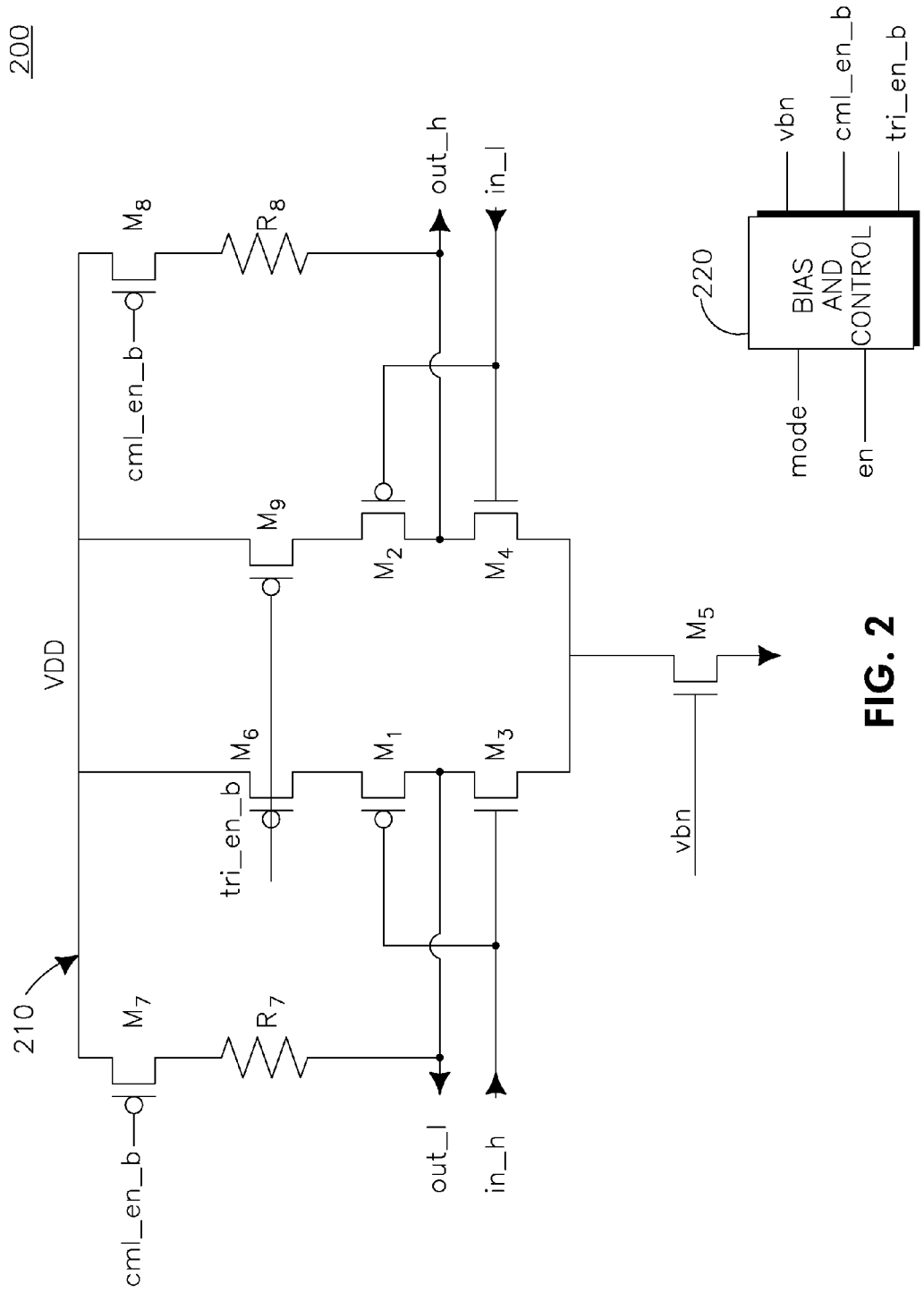
FIG. 2 is an alternative example of a dual function voltage and current mode differential driver.

FIG. 2 is an alternative example of a dual function voltage and current mode differential driver 200. The driver 200 is similar to the driver 100, and includes a driver portion 210 and bias and control circuitry 220. In the driver 210, an additional transistor $M_9$ is included. In this example, the drain of the transistor $M_6$ is connected to the source of transistor $M_1$, the gate is connected to tri_en_b, and the source is connected to VDD. Similarly, the drain of the transistor $M_9$ is connected to the source of transistor $M_2$, the gate is connected to tri_en_b, and the source is connected to VDD. The operation of the driver 200 is similar to the operation described above for the driver 100. However, in this embodiment, when the tri_en_b output is set to 0 V, both $M_6$ and $M_9$ are switched on.

Figure 3:
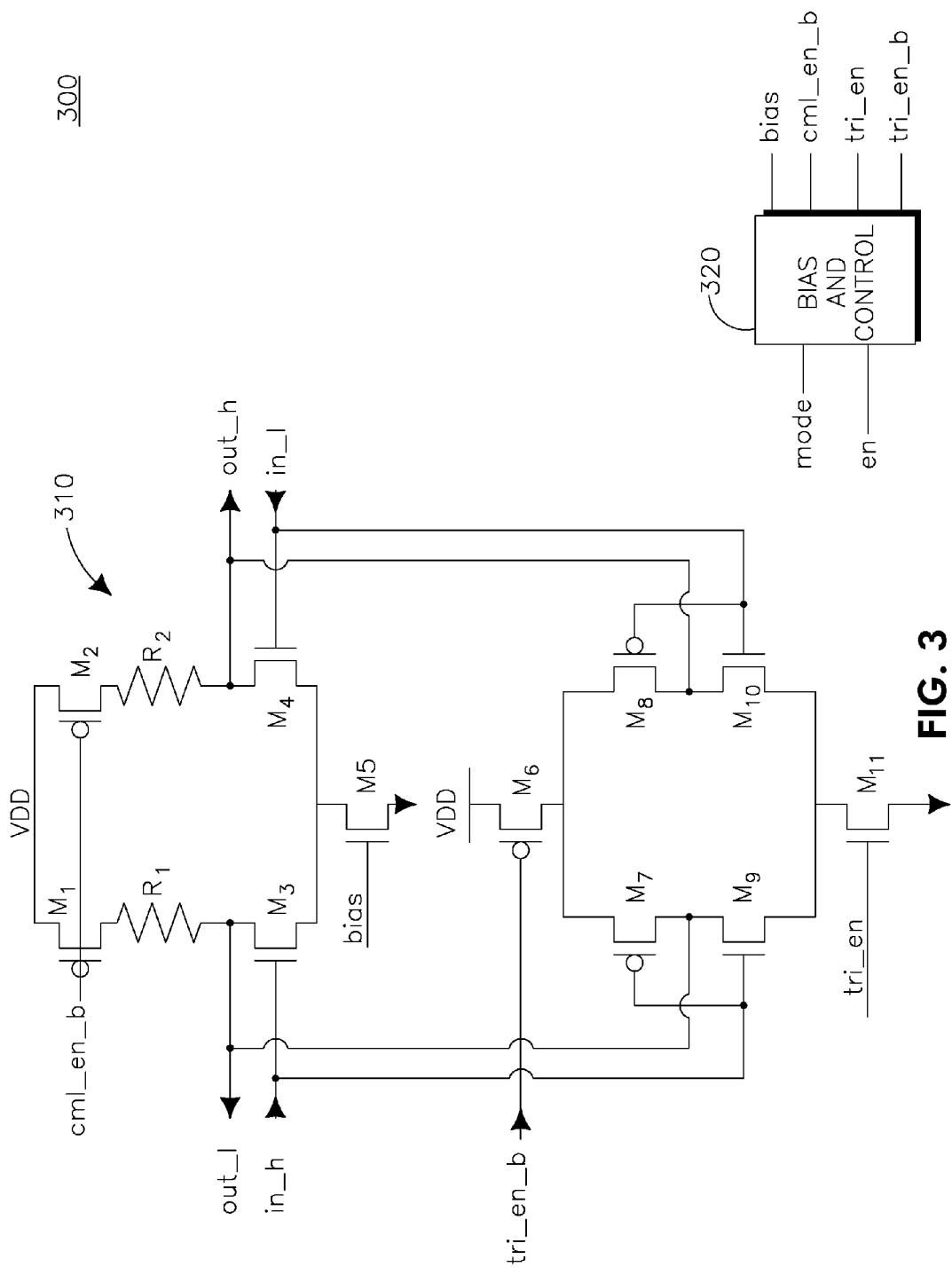
FIG. 3 is another alternative example of a dual function voltage and current mode differential driver.

FIG. 3 is another alternative example of a dual function voltage and current mode differential driver 300. The dual function voltage and current mode driver 300 includes a driver portion 310 and bias and control circuitry 320. The driver portion 310 of the driver 300 includes a current mode differential driver portion, which includes transistors $M_1$, $M_2$, $M_3$, $M_4$ and $M_5$ and resistors $R_1$ and $R_2$, and a voltage mode differential driver that includes transistors $M_6$, $M_7$, $M_8$, $M_9$, $M_{10}$ and $M_{11}$. The bias and control circuitry 320 receives an input and outputs a bias output, cml_em_b output, tri_en output, and tri_en_b output.

In the current mode differential driver portion, the sources of transistors $M_1$ and $M_2$ are connected to VDD, and the gates are connected to cml_en_b. The drain of $M_1$ is connected to one end of resistor $R_1$ and the drain of $M_2$ is connected to one end of resistor $R_2$. The sources of transistors $M_3$ and $M_4$ are connected to the drain of transistor $M_5$. The gate of $M_3$ is connected to in_h, and the drain is connected to the other side of resistor $R_1$ and out_l. The gate of $M_4$ is connected to in_l, and the drain is connected to the other side of resistor $R_2$ and out_h. The gate of $M_5$ is connected to the bias output of the bias and control circuitry 320 and the source is connected to the reference voltage.

In the voltage mode differential driver portion, the source of transistor $M_6$ is connected to VDD, and the gate is connected to tri_en_b. The sources of $M_7$ and $M_8$ are connected to the drain of transistor $M_6$. The drains of transistors $M_7$ and $M_9$ are connected to each other and out_l. The drains of transistors $M_8$ and $M_{10}$ are connected to each other and out_h. The sources of transistors $M_9$ and $M_{10}$ are connected to each other and to the drain of $M_{11}$. The gates of transistors $M_7$ and $M_9$ are connected to each other and in_h. The gates of transistors $M_8$ and $M_{10}$ are connected to each other and in_l. The gate of $M_{11}$ is connected to the tri_en output of the bias and control circuitry 320, and the source of is connected to reference voltage.

In operation, when the bias control circuitry 320 receives an input to switch the driver 300 to a voltage mode differential driver, the tri_en_b output is set to 0 V, cml_en_b is set to VDD, and tri_en is set to VDD. This results in transistors $M_1$ and $M_2$ being switched off, and disabling the current mode differential portion of the circuit, while transistor $M_6$ is switched on. In this configuration, when in_h is equal to VDD and in_l is equal to 0 V, out_h will be VDD and out_l will be 0 V. When in_l is equal to VDD and in_h is equal to 0 V, out_l will be VDD and out_h will be 0 V.

When the bias control circuitry 320 receives an input to switch the driver 300 to a current mode differential driver, the tri_en_b output is set to VDD, and cml_en_b is set to 0 V. As a result, transistors $M_1$ and $M_2$ are switched on, while transistor $M_6$ is switched off, disabling the voltage mode differential portion of the circuit. In this configuration, ff in_h is VDD and in_l is 0 V, then $M_3$ is switched on and $M_4$ is switched off. If in_l is VDD and in_h is 0 V, then $M_3$ is switched off and $M_4$ is switched on. The resistance of $R_7$ and $R_8$ may be collectively referred to as 'R'. The tail current of $M_5$ may be referred to as I5, and accordingly, when in_h is VDD and in_l is 0 V, then out_h is VDD and out_l is (VDD−I5*R). When in_h is 0 V and in_l is VDD, then out_h is (VDD−I5*R) and out_l is VDD.

Although features and elements are described above in particular combinations, each feature or element can be used alone without the other features and elements or in various combinations with or without other features and elements. The methods or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions (such instructions capable of being stored on a computer readable media). The results of such processing may be maskworks that are then used in a semiconductor manufacturing process to manufacture a processor which implements aspects of the present invention.

What is claimed is:

1. A dual function differential driver, comprising:
    a voltage mode differential driver portion, including a first, second, third and fourth transistor;
    a current mode differential driver portion, including the third transistor, the fourth transistor, a fifth transistor and a sixth transistor; and
    control circuitry connected to the voltage mode differential driver portion and the current mode differential driver portion to switch the dual function differential driver between operation as a voltage mode differential driver and operation as a current mode differential driver, or to disable the dual function differential driver;
    wherein the sources of the first and second transistors are switchable connected to a first voltage, the drain of the first transistor is connected to the drain of the third transistor and a first output line, the gate of the first transistor is connected to a first input line and the gate of the third transistor, the drain of the second transistor is connected to the drain of the fourth transistor and a second output line, the gate of the second transistor is connected to the gate of the fourth transistor and a second input line, the sources of the third and fourth transistors are switchably connected to a second voltage, the sources of the fifth and sixth transistors are connected to the first voltage, the gates of the fifth and sixth transistors are connected to the control circuitry, the drain of the fifth transistor is connected to the first output line and the drain of the sixth transistor is connected to the second output line.

2. The dual function differential driver of claim 1, further comprising a seventh transistor, the source of the seventh transistor connected to the first voltage, the drain of the seventh transistor connected to the sources of the first and second transistors, and the gate of the seventh transistor connected to the control circuitry, and wherein the control circuitry switches the fifth and sixth transistors to an on state and the seventh transistor to an off state during operation as a current mode driver, and switching the fifth and sixth transistors to an off state and the seventh transistor to an on state during operation as a voltage mode driver.

3. The dual function differential driver of claim 2, further comprising an eighth transistor, the drain of the eighth transistor connected to the sources of the third and fourth transistor, the source of the eighth transistor connected to the second voltage, and the gate of the eighth transistor connected to the control circuitry, and wherein the control circuitry switches the eighth transistor to an on state during operation as a current mode driver or voltage mode driver, and to an off state during disabling of the dual function differential driver.

4. The dual function differential driver of claim 3, further comprising a first resistor connected between the drain of the fifth transistor and the first output line and a second resistor connected between the drain of the sixth transistor and the second output line.

5. The dual function differential driver of claim 4 wherein the bias and control circuitry outputs a dual function bias/enable output, a tristate enable output, and a current mode enable output, the dual function bias/enable output connected to the gate of the eighth transistor for switching the eighth transistor on or off, the tristate enable output connected to the gate of the seventh transistor for switching the seventh transistor on and off, and the current mode enable output connected to the gates of the fifth and sixth transistors for switching the fifth and sixth transistors on and off.

6. The dual function differential driver of claim 5 wherein the bias and control circuitry further comprises a mode input and an enable input, the mode input indicating operation of the dual function differential driver in a current mode or a voltage mode, and the enable input indicating an enablement or disablement of the dual function differential driver.

7. The dual function differential driver of claim 1 wherein the first voltage is a source voltage and the second voltage is a reference voltage.

8. The dual function differential driver of claim 1 wherein the first, second, fifth and sixth transistors are P-metal oxide semiconductor (PMOS) transistors and the third and fourth transistors are NMOS transistors.

9. The dual function differential driver of claim 8 wherein the seventh transistor is a PMOS transistor and the eighth transistor is an NMOS transistor.

* * * * *

UNITED STATES PATENT AND TRADEMARK OFFICE
CERTIFICATE OF CORRECTION

| | |
|---|---|
| PATENT NO. | : 8,149,024 B2 |
| APPLICATION NO. | : 12/633174 |
| DATED | : April 3, 2012 |
| INVENTOR(S) | : Liu et al. |

It is certified that error appears in the above-identified patent and that said Letters Patent is hereby corrected as shown below:

IN THE CLAIMS

Column 6, Line 21, Claim 1, delete the word "switchable" and insert therefore --switchably--.

Signed and Sealed this
Seventeenth Day of July, 2012

David J. Kappos
*Director of the United States Patent and Trademark Office*